United States Patent
Krassnitzer et al.

(10) Patent No.: US 9,416,441 B2
(45) Date of Patent: Aug. 16, 2016

(54) HIPIMS LAYERING

(71) Applicant: Oerlikon Surface Solutions AG, Trubbach, Trubbach (CH)

(72) Inventors: Siegfried Krassnitzer, Feldkirch (AT); Markus Lechthaler, Feldkirch (AT)

(73) Assignee: OERLIKON SURFACE SOLUTIONS AG, PFAFFIKON, Pfaffikon SZ (CH)

( * ) Notice: Subject to any disclaimer, the term of this patent is extended or adjusted under 35 U.S.C. 154(b) by 0 days.

(21) Appl. No.: 14/357,003

(22) PCT Filed: Oct. 26, 2012

(86) PCT No.: PCT/EP2012/004498
§ 371 (c)(1),
(2) Date: May 8, 2014

(87) PCT Pub. No.: WO2013/068080
PCT Pub. Date: May 16, 2013

(65) Prior Publication Data
US 2014/0305792 A1    Oct. 16, 2014

(51) Int. Cl.
C23C 14/35    (2006.01)
H01J 37/34    (2006.01)
C23C 14/34    (2006.01)

(52) U.S. Cl.
CPC .............. *C23C 14/35* (2013.01); *C23C 14/345* (2013.01); *C23C 14/3485* (2013.01); *H01J 37/3467* (2013.01)

(58) Field of Classification Search
CPC .. C23C 14/345; C23C 14/3485; C23C 14/35; H01J 37/3467
USPC .......................... 204/192.15, 192.16, 192.12
See application file for complete search history.

(56) References Cited

U.S. PATENT DOCUMENTS

| | | | |
|---|---|---|---|
| 2009/0068450 A1* | 3/2009 | Muenz et al. | 428/336 |
| 2011/0168547 A1 | 7/2011 | Horstmann | |
| 2013/0276984 A1* | 10/2013 | Papa et al. | 156/345.43 |

FOREIGN PATENT DOCUMENTS

| | | |
|---|---|---|
| DE | 10 2008 028 140 B3 | 12/2009 |
| DE | 20 2010 001 497 U1 | 5/2010 |
| WO | 2012/089286 A1 | 7/2012 |

OTHER PUBLICATIONS

International Search Report issued in Application No. PCT/EP2012/004498 dated Mar. 4, 2013.
Lin et al., "Ion energy and mass distributions of the plasma during modulated pulse power magnetron sputtering", Surface and Coatings Technology, Elsevier, Amsterdam, NL, vol. 203, No. 24 dated Sep. 15, 2009, pp. 3676-3685.
Ehiasarian et al., "Influence of high power impulse magnetron sputtering plasma ionization on the microstructure of TiN thin films", Journal of Applied Physics, American Institute of Physics. vol. 109, No. 10, dated May 23, 2011.

* cited by examiner

*Primary Examiner* — Rodney McDonald
(74) *Attorney, Agent, or Firm* — Pearne & Gordon LLP

(57) ABSTRACT

The present invention relates to a method for the vapor deposition of PVD layer systems by means of sputtering on at least one substrate, wherein the layer system comprises at least a first layer, characterized in that, at least in one step of the method, a HiPIMS method is used with a power density of at least 250 W/Cm$^2$, wherein a pulse length with a duration of at least 5ms is used while a substrate bias is applied to the substrate.

7 Claims, 1 Drawing Sheet

HIPIMS LAYERING

The present invention relates to hard-material layers that are deposited onto workpieces by means of physical vapor deposition (PVD), indeed by means of magnetron sputtering (MS).

Two essential process variants of magnetron sputtering are the classic CD-MS and the HiPIMS process.

In the case of HiPIMS, the target supplying the sputter material is subjected to a very high discharge current density, so that a high electron density is generated in the plasma and the sputtered particles are ionized to a high degree. For this, current densities between 250 W/cm$^2$ and 2000 W/cm$^2$ are used and particular requirements are therefore made of the generator supplying the power. In particular, it is not possible to have such a power being applied onto the target continuously over time, since the latter would overheat and become damaged. The power therefore needs to be pulsed. Within the power pulse, very high desired discharge densities are achieved and the target heats up, and during the no-impulse period (impulse pause) the target can cool down again. Impulse duration and no-impulse period must be coordinated with one another in such a manner that the average power reaching the target does not exceed a threshold value. For HiPIMS, generators are needed that are capable when pulsed of supplying a very high power.

Special generators are therefore most commonly used for HiPIMS that are based on the principle of the discharge of capacitors, which leads to a discharge current that changes during the course of the impulse. A controlled process for the current-voltage evolution cannot be achieved in this way. According to another approach, the plasma is first pre-ionized, in order then to be able to increase the impulse duration within the high power pulse. The discharge current in this respect can be controlled by modulating the applied voltage. In this manner, impulses up to 4 ms can be maintained.

The situation is totally different if sputtering is performed with a low power density, i.e. for example between 5 W/cm$^2$ and 50 W/cm$^2$. In this case, power can be applied continuously to the target. Simple generators can be used since it is not necessary to supply a high power nor does the power supply need to be pulsed. In such a case, it is the classic CD-MS.

If HiPIMS layers are compared with DC-MS layers, considerable structural differences become evident. Using the example of TiAlN coatings, the latter grow in DC-MS essentially in a columnar structure (see FIG. 1). In the HiPIMS process, by contrast, a finer layer structure can e achieved without integration of working gas ions into the layer thanks to the ionization of the evaporated metal, because in the case of a negative bias applied to the substrate, the ionized metal atoms themselves are accelerated onto the substrate. An additional advantage is that in HiPIMS layers, a negative substrate bias results in a higher density of the layers due to the high on proportion in the sputtered material.

The fine HiPIMS layers may be harder and denser than the coarse columnar DC-MS layers, but they also have disadvantages in terms of layer adhesion and mechanical properties. Such fine HiPIMS layers do exhibit improved wear-and-tear behavior as compared with DC-MS layers, which results in a longer service lifetime. The disadvantage, however, is that the wear-and-tear, i.e. the end of the layer's longevity, does not become apparent but, probably due to the mechanical properties, quickly appears, for example in the form of spalling. It is thus very difficult for the user to estimate when the coated tools need to be replaced.

The task of the invention is therefore to disclose coatings that have the degrees of hardness typical for HiPIMS technology but whose wear-and-tear during use is made apparent to the user for example with the decrease in performance efficiency occurring over time, so that the user has the possibility of replacing the corresponding tools.

DETAILED DESCRIPTION

As explained above, HiPIMS generators are currently known with which an impulse duration of maximum 4 ms can be achieved. Thanks to a new method for supplying impulses with a higher output, it has now however become possible to achieve impulse durations of 25 ms and more.

In this method, the procedure is to operate a PVD sputter cathode, which comprises a first partial cathode and a second partial cathode, wherein for the partial cathodes a maximum average power application is specified and wherein the duration of the power pulse intervals is specified and wherein the method comprises the following steps:

a) supplying a generator with predetermined power supply that is preferably constant at least after switching on and after completion of a power buildup interval
b) switching on the generator
c) connecting the first partial cathode to the generator, so that power from the generator is applied to the first partial cathode
d) disconnecting the generator from the first partial cathode after expiration of a prescribed first power pulse interval corresponding to the first partial cathode
e) connecting the second partial cathode to the generator, so that power from the generator is applied to the second partial cathode
f) disconnecting the generator from the second partial cathode after expiration of a prescribed second power pulse interval corresponding to the second partial cathode wherein the first power pulse interval starts temporally before the second power pulse interval and the first power pulse interval ends temporally before the second power pulse interval, wherein the steps d) and e) are executed in such a way that the first power pulse interval and the second power pulse interval overlap time-wise and all power pulse intervals together form a first group, so that the power supply from the generator persists continuously without interruption from the beginning of the first power pulse interval until the end of the second power pulse interval and there is no second power buildup interval.

Figure 1:
FIG. 1 shows an example coating by magnetron sputtering.
Figure 2:
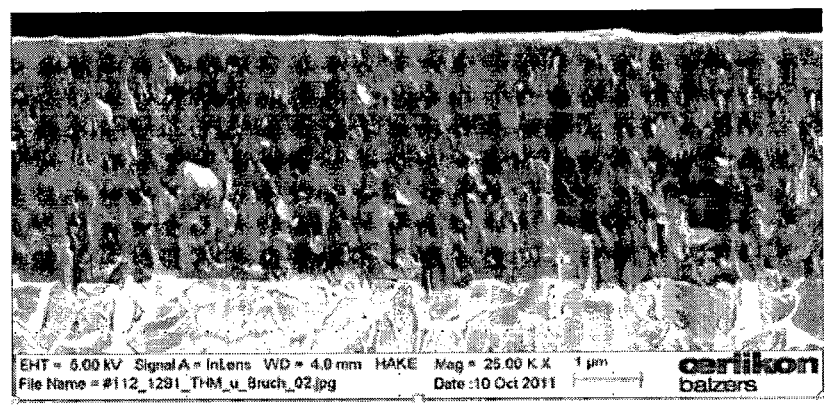
FIG. 2 shows another example coating by magnetron sputtering.
Figure 3:
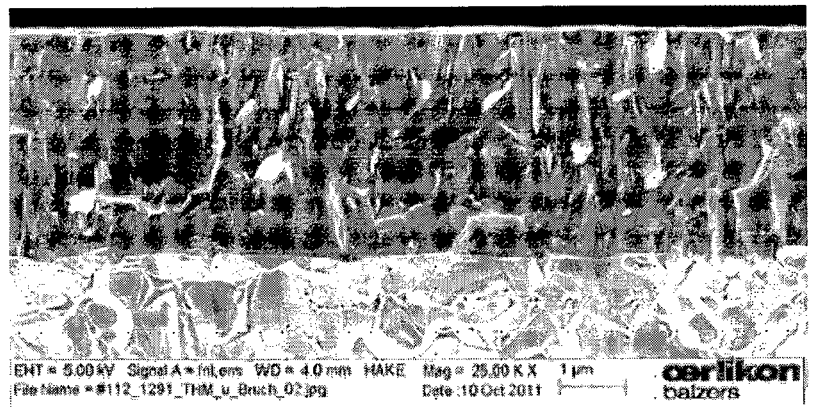
FIG. 3 shows still another example coating by magnetron sputtering.

When implementing this method, the inventors discovered to their surprise that tools that had been coated with HiPIMS layers with an impulse duration of 5 ms or more show towards the end of the lifetime of the coated tool a significantly different behavior than tools that had been coated with HiPIMS layers with shorter impulse durations. interestingly, SEM images of breaking edges of the layers deposited with the long impulses a more coarsely pronounced morphology, as is clearly visible in FIG. 3. In this respect, this difference in the layer morphology can be achieved simply by the variation of the impulse length, without changing any other influencing parameters.

The inventive layers deposited with an impulse duration of 5 ms or more exhibit an increased e-modulus as well as greater hardness as compared with layers deposited with shorter impulses.

For example, the inventors deposited TiAlN layers by means of the HiPIMS method one the one hand with an impulse length of 250 μs and on the other hand with an impulse duration of 25000 μs. The layers deposited with an impulse length of 250 μs showed an e-modulus of approx. 425 GPa and had a hardness of 2900 HV, whilst the layers deposited with an impulse length of 25000 μs showed an e-modulus of 475 GPa and had a hardness of more than 3100 HV.

Since the method described above for providing power pulses enables the pulse length to he adjusted and also to be varied in a very simple manner, it is possible during a coating process to build a layer system in which HiPIMS layers with a finer and a coarser morphology alternate. This is achieved in a simple manner by choosing in an alternating fashion a short and a long impulse duration during the deposition process. Since for both types of deposition approximately the same layer tensions were measured, such an alternating layer system has, as expected, very good properties in terms of reduction of wear-and-tear. The alternating layer system can further exhibit abrupt transitions so that real boundary surfaces are formed between fine-grained layer and coarse-grained layer. It is however also possible to achieve one or several gradual transitions by varying the impulse duration steadily rather than abruptly.

It must be noted that in the same coating operation, the height of the power pulse can of course also be varied. In particular, it is possible at times to choose such a low impulse height that it yields layer areas with the columnar growth typical for DC-MS. It is also possible in this manner to achieve an alternating layer system from HiPIMS layers and DC-MS, which due to the differences in layer tensions can contribute to the stability of the layer system.

What is claimed is:

1. Method for depositing PVD layer systems by vapor deposition by means of sputtering on at least one substrate, wherein the layer system comprises at least a first layer and a second layer, said first and second layers being deposited by using a HiPIMS method which enables operating at least two partial cathodes and attaining power densities of 250 W/cm$^2$ or higher and impulse length durations of 5 ms or longer, characterized in that the method comprises the deposition of the first or the deposition of the second HiPIMS layer by applying power impulses having impulse length with a duration of at least 5 ms for attaining a power density of at least 250 W/cm$^2$ whilst on the substrate a substrate bias is applied, and wherein, for the deposition of another of the first or second HiPIMS layer, power impulses having impulse length with shorter duration are used, so that the morphology of the HiPIMS layer deposited by using power impulses having impulse length with longer duration differs from the morphology of the HiPIMS layer deposited by using power impulses having impulse length with shorter duration, wherein the longer duration and the shorter duration are chosen in such a manner that the layer deposited by using the longer duration of the impulse length shows a coarser morphology than the layer that was deposited using shorter impulse length and in this manner the PVD layer system comprises a coarser-grained layer and a finer-grained layer, where the coarser-grained layer is the layer showing the coarser morphology.

2. Method according to claim 1, characterized in that the PVD layer systems comprises a multiplicity of HiPIMS deposited finer-grained layers and coarser-grained layers which are deposited alternate forming an alternating layer system.

3. Method according to claim 1, characterized in that the duration of the impulse length is varied at least one time steadily in order to attain a gradual transition between two layers having respectively finer-grained and coarser-grained morphology.

4. Method according to claim 1, characterized in that height of the power impulses is at least one time varied.

5. Method according to claim 4, characterized in that the height of the power impulses is at least at times varied in order to choose a low impulse height which yields layer areas with columnar growth.

6. Method according to claim 1, characterized in that the power density does not exceed 2000 W/cm$^2$.

7. Method according to claim 1, characterized in that the impulse length is made to vary during the method, which causes the layer system with HiPIMS layers of different morphology to be generated, wherein the impulse length is made to vary in such a manner that the transition between the layers of different morphology is at least once a gradual transition.

* * * * *